United States Patent
Schuss et al.

(10) Patent No.: US 8,053,700 B2
(45) Date of Patent: Nov. 8, 2011

(54) APPLICATORS AND COOLING SYSTEMS FOR A PLASMA DEVICE

(75) Inventors: Jack J. Schuss, Newton, MA (US); Xing Chen, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 1277 days.

(21) Appl. No.: 11/541,388

(22) Filed: Sep. 29, 2006

(65) Prior Publication Data

US 2007/0079935 A1    Apr. 12, 2007

Related U.S. Application Data

(63) Continuation-in-part of application No. 11/058,620, filed on Feb. 15, 2005, now Pat. No. 7,501,600, which is a continuation of application No. 10/417,408, filed on Apr. 16, 2003, now Pat. No. 6,872,909.

(51) Int. Cl.
*B23K 10/00* (2006.01)

(52) U.S. Cl. ......... 219/121.52; 219/121.48; 219/121.43; 219/121.51; 118/723 I

(58) Field of Classification Search ............ 219/121.51, 219/121.52, 121.43, 121.48, 121.59; 118/723 I
See application file for complete search history.

(56) References Cited

U.S. PATENT DOCUMENTS

| | | | |
|---|---|---|---|
| 1,534,251 A | 4/1925 | Smith | |
| 3,291,715 A | 12/1966 | Anderson | |
| 4,615,851 A | 10/1986 | Theodore et al. | 264/63 |
| 5,051,557 A * | 9/1991 | Satzger | 219/121.52 |
| 5,273,609 A | 12/1993 | Moslehi | 156/345 |
| 5,541,385 A | 7/1996 | Konkola | 219/121.6 |
| 5,834,905 A | 11/1998 | Godyak et al. | 315/248 |
| 5,972,450 A | 10/1999 | Hsich et al. | 428/35.9 |
| 6,037,562 A | 3/2000 | Awakowicz et al. | 219/121.59 |
| 6,063,233 A | 5/2000 | Collins et al. | 156/345 |
| 6,150,628 A | 11/2000 | Smith et al. | 219/121.54 |
| 6,156,667 A | 12/2000 | Jewett | 438/715 |
| 6,167,835 B1 | 1/2001 | Ootera et al. | 118/723 |
| 6,329,297 B1 | 12/2001 | Balish et al. | 438/714 |
| 6,387,288 B1 | 5/2002 | Bjorkman et al. | 216/67 |
| 6,418,874 B1 | 7/2002 | Cox et al. | 118/723 |
| 6,461,409 B1 | 10/2002 | Neff et al. | 95/78 |
| 6,762,393 B2 | 7/2004 | Choi | 219/121.36 |
| 6,815,633 B1 | 11/2004 | Chen et al. | 219/121.54 |
| 6,872,909 B2 | 3/2005 | Holber et al. | 219/121.52 |
| 7,393,765 B2 * | 7/2008 | Hanawa et al. | 438/515 |
| 2003/0129106 A1 | 7/2003 | Sorensen et al. | 422/186.05 |
| 2005/0145173 A1 | 7/2005 | Holber et al. | 118/723 E |

* cited by examiner

*Primary Examiner* — Mark Paschall
(74) *Attorney, Agent, or Firm* — Proskauer Rose LLP

(57) ABSTRACT

An improved plasma vessel (i.e., plasma applicator) that provides effective cooling includes a plurality of generally linear tubes having a dielectric interior fluidly connected together by dielectric connectors. The tubes and connectors are joined together to form a leak-tight plasma vessel. A cooling system surrounding the improved plasma vessel includes a rigid cooling plate and a deformable thermal transfer material disposed between the plasma vessel and the cooling plate. After use or at an operator's discretion, the plasma vessel can be removed from the cooling system and a new vessel may be inserted in its place. Alternatively, the used vessel may be refurbished and re-inserted into the cooling system. The new or refurbished vessel may or may not be of the same size or configuration as the used vessel. Thermal contact between the cooling system and the new or refurbished vessel, however is maintained through the deformable thermal transfer material.

45 Claims, 11 Drawing Sheets

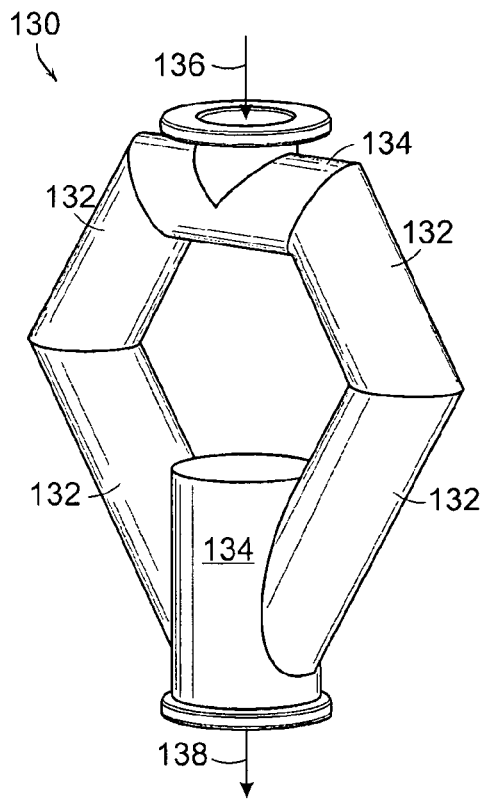
FIG. 5G
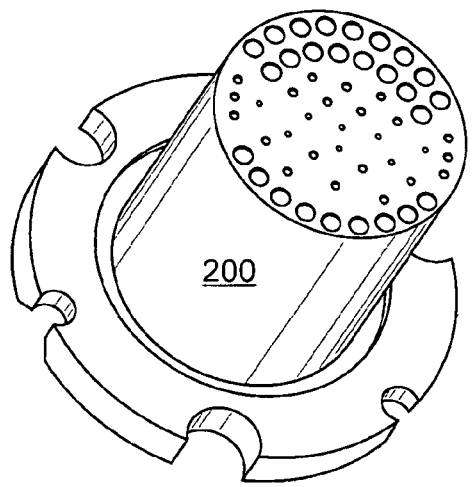
FIG. 6
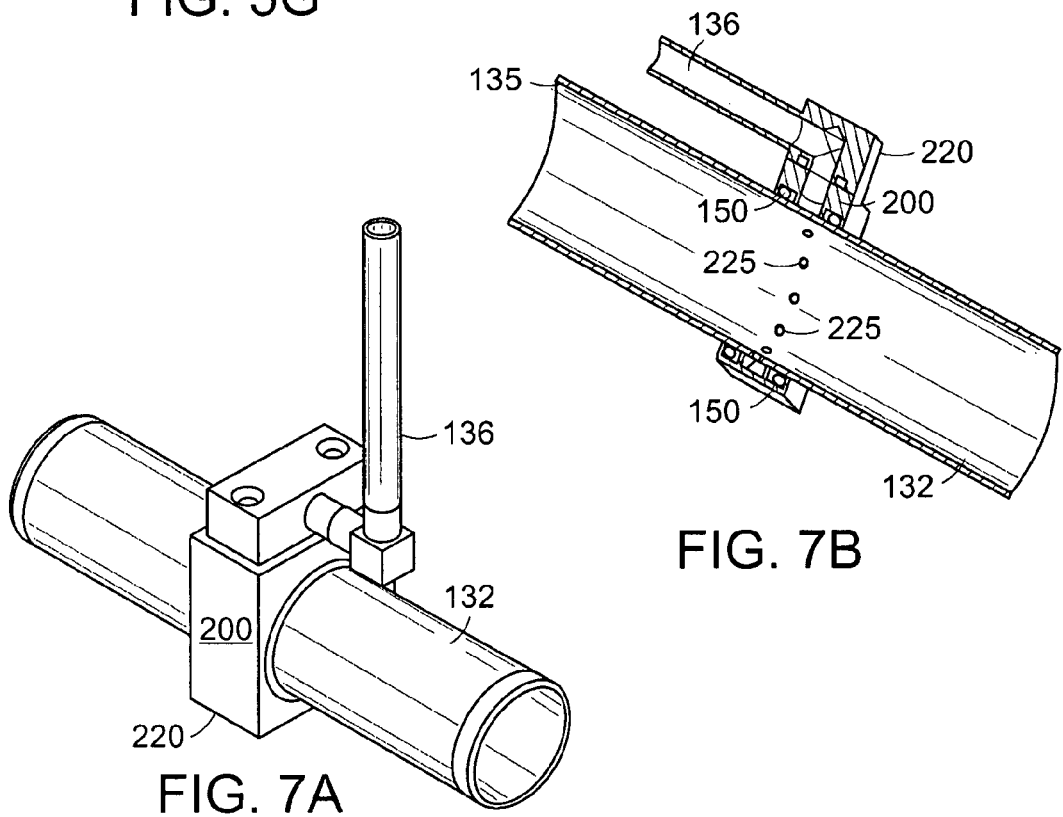
FIG. 7B
FIG. 7A ns. 11/058,620 and
APPLICATORS AND COOLING SYSTEMS FOR A PLASMA DEVICE

RELATED APPLICATIONS

This application is a continuation in part of U.S. patent application Ser. No. 11/058,620, filed on Feb. 15, 2005. U.S. patent application Ser. No. 11/058,620 is a continuation of U.S. patent application Ser. No. 10/417,408, filed on Apr. 16, 2003 and issued as U.S. Pat. No. 6,872,909. The entire disclosures of U.S. patent application Ser. Nos. 11/058,620 and 10/417,408 and U.S. Pat. No. 6,872,909 are incorporated herein by reference.

FIELD OF THE INVENTION

The present invention relates generally to plasma generation and processing equipment. In particular, the present invention relates to applicators and a cooling systems for a plasma device.

BACKGROUND

Plasma discharges can be used to dissociate gases to produce activated gases containing ions, free radicals, atoms and molecules. Activated gases are used for numerous industrial and scientific applications including processing materials such as semiconductor wafers, powders, an other gases. The parameters of the plasma and the conditions of the exposure of the plasma to the material being processed vary widely depending on the application.

For example, some applications require the use of ions with low kinetic energy (e.g., a few electron volts) because the material being processed is sensitive to damage, or because there is a requirement for selective etching one material relative to another. Other applications, such as anisotropic etching or planarized dielectric deposition, require the use of ions with high kinetic energy.

Some applications require direct exposure of the material being processed to a high density plasma. Such applications include ion-activated chemical reactions and etching of and depositing of material into high aspect-ratio structures. Other applications require shielding the material being processed from the plasma because the material is sensitive to damage caused by ions or because the process has high selectivity requirements.

Plasmas can be generated in various ways including direct current (DC) discharge, radio frequency (RF) discharge, and microwave discharge. DC discharges are achieved by applying a potential between two electrodes in a gas. RF discharges are achieved either by capacitively or inductively coupling energy from a power supply into a plasma. For example, parallel plates can be used to capacitively couple energy into a plasma and induction coils can be used to induce current in the plasma. Microwave discharges can be produced by coupling a microwave energy source to a discharge chamber containing a gas.

Plasma discharges may be generated in a manner such that both the charged species constituting the plasma and the neutral species, which may be activated by the plasma, are in intimate contact with the material being processed. Alternatively, the plasma discharge may be generated remotely from the material being processed, so that relatively few of the charged species comes into contact with the material being processed, while the neutral species may still contact it. Such a plasma discharge is commonly termed a remote or downstream plasma discharge. Depending on its construction, position relative to the material being processed, and operating conditions (gas species, pressure, flow rate, and power into the plasma), a plasma source can have characteristics of either or both of these two types.

Existing remote plasma sources generally utilize RF or microwave power to generate the plasma. Although present sources support many applications successfully, several limitations remain with respect to practical use of these plasma devices. One such limitation resides within the plasma applicator (i.e., the plasma vessel). For example, over time, the plasma applicator can become worn from use. Specifically, reactive species may deposit or etch the walls of the plasma applicator. Current designs do not allow for efficient refurbishment of the applicator due to complex mounting and cooling arrangements. In addition, current plasma applicators are made from processed materials (e.g., channels forming the flow path within the applicator are drilled or etched into a block of starting material). As a result, the channels typically contain a high number of surface defects, which can lead to higher particle/contaminant generation during plasma generation.

Moreover, some applications require the use of highly corrosive gasses and/or plasmas (e.g., F containing gasses and plasmas). These applications require the use of plasma applicators made from expensive materials to process, such as, for example sapphire, that can withstand exposure to the corrosive environment without becoming structurally compromised. Other applications, which do not involve corrosive materials, can be accomplished using an applicator made from a less expensive material, such as, for example, quartz. Current designs are limited to the use of either a corrosive resistant, expensive applicator or a less expensive, corrosive non-resistant applicator. As a result, a user needs to have at least one dedicated plasma source for corrosive applications.

A second difficulty with existing remote plasma sources is removal of the heat generated in the plasma and transferred to the walls of the plasma vessel. This is especially the case when the plasma vessel has a complex shape and when it is composed of a dielectric material for which direct cooling with large quantities of fluid in contact with the dielectric vessel is either undesirable or impractical. In addition, the cooling components used to cool the complex shapes of plasma applicators further limits refurbishment of worn applicators or interchangability of an applicator with a different material type applicator.

SUMMARY OF THE INVENTION

In general, one aspect of the present invention features a plasma apparatus formed from a plurality of as-grown tubes that have a dielectric interior surface. One of the advantages of utilizing as-grown tubes in a plasma apparatus is the minimization of defects, which lead to particle generation in plasma systems. That is, plasma apparatus that use machined tubes or channels typically have a high concentration of defects along the channel walls. Under the influence of a plasma environment, particles or chunks of material forming the defect (and/or covering the defect in the event that the machined tubes have been surface treated) may detach resulting in particle contamination of the plasma system. Plasma apparatus utilizing as-grown tubes generally do not have as high of a defect concentration and thus emit less particles from the walls of the tubes than experienced with prior art plasma systems.

Another aspect of the present invention features a plasma apparatus including a plurality of generally linear tubes having a dielectric interior surface, connectors fluidly connecting at least two of the plurality of generally linear tubes, and a gas injector connected to at least one of the plurality of the plurality of generally linear tubes or at least one of the connectors.

This aspect of the invention can include one or more of the following features. The generally linear tubes can be formed of dielectric tubes, such as, for example sapphire tubes, quartz tubes, yttrium oxide tubes, magnesium fluoride tubes, alumina tubes, or a combination of the foregoing tubes. In some embodiments, the generally linear tubes are formed of metal tubes that have a dielectric film coating an interior tubular surface. In certain embodiments, the plasma apparatus may further include a gas delivery port fluidly connected to at least one of the connectors. The plurality of generally linear tubes may include an ultra-violet blocking film (e.g., alumina film, yttrium oxide film, titanium dioxide film, magnesium fluoride film, magnesium oxide film, silicon dioxide film, perfluoride film, sputtered metallic film, a film formed of a combination of paint and an ultra-violet blocking filler such as silicon dioxide, titanium dioxide, or clay, or a film formed of a combination of the foregoing materials) disposed on an outer tubular surface. In some embodiments, the connectors are formed of a metal including an interior surface coated with a dielectric material. In other embodiments, the connectors are formed of a dielectric material. The plurality of generally linear tubes and connectors can be arranged to form a torodial vessel. In certain embodiments, the gas injector is positioned along a wall of one of the plurality of generally linear tubes. The gas injector may be formed as a manifold surrounding a plurality of holes disposed within a tubular wall. In other embodiments, the gas injector may be disposed relative to one of the connectors (e.g., disposed within one of the connectors or fluidly coupled to one of the connectors). The plasma apparatus may also include a gas delivery port. The gas delivery port may be fluidly coupled to one of the connectors or to one of the plurality of generally linear tubes. The gas delivery port may be formed as a manifold. In certain embodiments, the plasma apparatus includes a second gas injector for delivering a corrosive gas into the plasma apparatus. The second gas injector is located near (i.e., adjacent to) the gas delivery port. The plasma apparatus may also include sealing elements, such as metal or metallic coated radial o-rings or crush o-rings, disposed at a junction between one of the plurality of generally linear tubes and one of the connectors. The connectors may receive an end portion of one or more of the plurality of generally linear tubes. The plasma apparatus may also include a cooling system including a heat sink positioned relative to the plurality of generally linear tubes. The heat sink may be fluid-cooled, such as for example by a fluid-cooled cooling plate. The cooling system may also include an intermediary material, such as a thermal transfer material (e.g., a soft potting material or a thermal pad), positioned between the heat sink and the plurality of generally linear tubes. In some embodiments, the heat sink of the cooling system includes at least two segments coupled by at least one spring-loaded mechanism.

One of the advantages of this aspect of the invention, is that the plasma apparatus due to being formed of individual tubes rather than a solid block of material with channels formed within, may be easily configured into an appropriate shape and can be easily refurbished through cleaning and/or replacement of one or more of the individual tubes.

In general, another aspect of the invention features a plasma apparatus including a plurality of as-grown tubes having a dielectric interior, a gas injector, and a connector having a dielectric interior portion. Each of the plurality of as-grown tubes are bonded to at least one other as-grown tube to form a plasma vessel having a gas delivery port. The gas injector is fluidly connected to the plasma vessel and the connector is fluidly connected to the gas delivery port.

This aspect of the invention can include one or more of the following features. A plasma tool, such as a deposition chamber, can fluidly attached to the connector. The bonds between as-grown tubes may be formed by brazing, welding, or diffusion bonding techniques. The plurality of as-grown tubes can be formed of quartz tubes. The gas injector may be fluidly connected to at least one of the plurality of as-grown tubes. In some embodiments, the gas injector is formed of a manifold surrounding a plurality of holes disposed within a tubular wall. In other embodiments, the gas injector is fluidly connected to a gas inflow port. The connector may be formed of a dielectric material, such as, for example, sapphire or alumina. The gas delivery port may be defined by a non-bonded first end of one of the plurality of as-grown tubes and a non-bonded second end of another one of the plurality of as-grown tubes. The non-bonded first and second ends can be positioned at an angle to each other that optimizes gas flow through the connector. Examples of suitable angles include an angle between about 10 degrees and about 180 degrees. For a vessel formed of three tubes, the angle may be between about 10 degrees and 90 degrees. For a vessel formed of four tubes, the angle may be between about 10 degrees and 90 degrees. The plasma vessel may further include an ultra-violet blocking film disposed on an exterior vessel surface. In some embodiments, the plasma vessel of the plasma apparatus further includes a cooling system including a heat sink provided relative to the plasma vessel. The heat sink may include a water-cooled cooling plate. In some embodiments, the heat sink may include two or more segments that are coupled by at least one spring-loaded mechanism. In certain embodiments, the cooling system includes an intermediate material, such as a thermal transfer material (e.g., a soft potting material or a thermal pad), positioned between the heat sink and the plasma vessel.

In another aspect, the invention features a plasma processing apparatus. The plasma processing apparatus includes a torodial vessel comprising a plurality of fluidly-connected as-grown tubes having a dielectric interior surface, a transformer comprising a magnetic core and a primary winding that surrounds a portion of the vessel, and a power supply that supplies power to the primary winding to generate a plasma.

In another aspect, the invention features a method of providing gas to a plasma vessel formed of tubes having a dielectric interior surface. The method includes connecting a gas source to a manifold, the manifold surrounding and fluidly coupled to a plurality of apertures formed in a wall of one of the tubes; and delivering the gas from the gas source to the plasma vessel through the manifold and the plurality of apertures formed in the wall of one of the tubes.

In a further aspect, the invention features a method of manufacturing a plasma apparatus. The method includes connecting a plurality of generally linear tubes and connectors to form a torodial plasma vessel (each of the plurality of generally linear tubes has a dielectric interior surface); forming a fluid port within a wall of one of the generally linear tubes; and attaching a gas injector to the fluid port. Some embodiments of this aspect feature securing the plurality of generally linear tubes and connectors with sealing elements, such as, for example, o-rings. In other embodiments, the method features connecting the plurality of generally linear tubes and connectors by brazing, welding, or diffusion bonding.

In another aspect, the invention features a method of manufacturing a plasma apparatus. The method includes bending a dielectric tube having a first end and a second end to form a portion of a plasma vessel; bonding the first end of the dielectric tube to a dielectric connector; connecting the second end of the dielectric tube to either a second dielectric tube or to a second dielectric connector to form the plasma vessel.

This aspect of the invention includes one or more of the following features. In certain embodiments, bonding the first end of the dielectric tube to a dielectric connector includes brazing, welding or diffusion bonding. In another embodiment, connecting comprises securing with at least one sealing element. In some embodiments, connecting comprises brazing, welding or diffusion bonding.

In a further aspect, the invention features a plasma device including a tube having a dielectric interior surface and an exterior surface, a connector having a dielectric interior portion, and a sealing element. The tube and the connector are joined to form an overlap portion and the sealing element is positioned adjacent to the overlap portion and in contact with the exterior surface of the tube.

Embodiments of this aspect of the invention can include one or more of the following features. The sealing elements utilized in the plasma device include o-rings and in some embodiments, the combination of an o-ring and a crush plate. In certain embodiments, the o-rings can be further compressed by a fastener. The o-rings may be made from a metal or can be metal coated. The plasma device, in some embodiment, may include a plurality of tubes and two of the plurality of tubes may be joined to the connector using three sealing elements.

DESCRIPTION OF THE FIGURES

In the drawings, like reference characters generally refer to the same parts throughout the different views. Also, the drawings are not necessarily to scale, emphasis instead being placed upon illustrating the principles of the invention.

FIGS. 5A-5G are illustrations of different embodiments of a plasma vessel in accordance with the invention.

FIG. 6 is a perspective view of a gas injector in accordance with one embodiment of the invention.

FIGS. 7A-7B illustrate a gas injector in accordance with another embodiment of the invention.

DESCRIPTION

Figure 1:
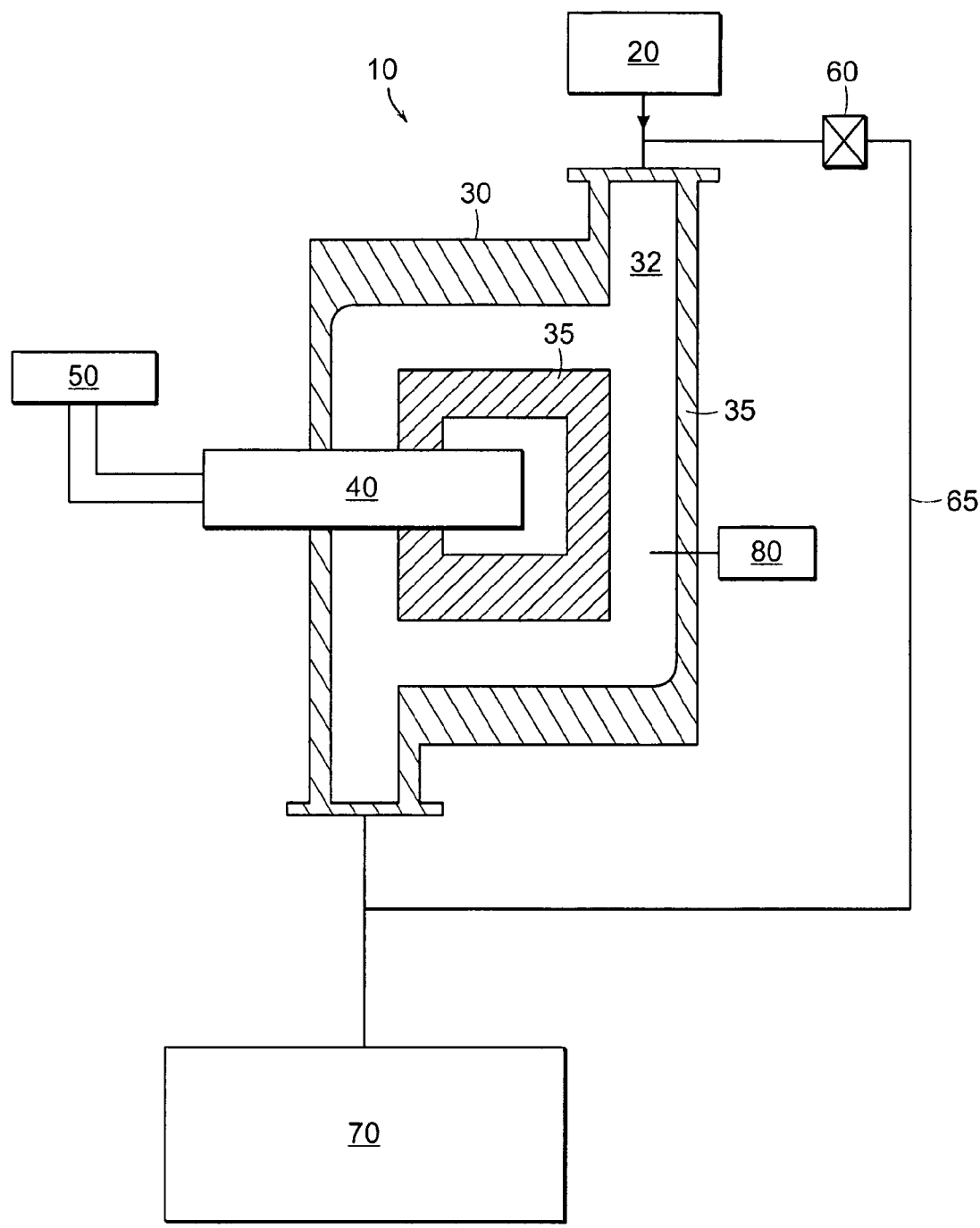
FIG. 1 is a block diagram illustrating a plasma device including a prior art plasma vessel.

FIG. 1 illustrates a prior art plasma device 10. The prior art plasma device 10 includes a gas source 20 and a torodial plasma vessel (i.e. applicator) 30 including plasma channels 32 surrounded by at least one magnetic core 40 that is in electrical communication with an AC power supply 50. As gas from the gas source 20 enters the channels 32 of the plasma vessel 30, inductive energy radiated from the magnetic core 40 powered by power supply 50 ionizes the gas to create a plasma. This plasma then exits the channels 32 and enters a plasma processing chamber 70 containing at least one workpiece to be processed.

In general, the plasma vessel 30 is formed from a dielectric material or a metal material coated with a dielectric material. These unitary plasma vessels 30 have a torodial shape (i.e., loop shape) such as the shape exhibited by a donut. In certain embodiments, the vessel 30 can have a rectangular donut shape as shown in FIG. 1 or any type of modified donut shape, such as, for example, square donut shape, round donut shape, or circular donut shape. The channels 32 within vessel 130 are formed by drilling, etching, or machine grinding materials forming the channel walls. As a result, the plasma vessel 30 has a unique, complex shape that may have a varying thickness throughout channel walls 35. Also, the channel walls 35 contain a high concentration of surface defects (e.g., more than about 20% of the surface area of the channel walls are filled with defects) due to the harsh processing conditions. These surface defects serve as unwanted nucleation sites for particle generation during plasma processing. For example, defects, like microcracks, have a higher surface energy than a smooth surface with no or minimal imperfections. Without wishing to be bound by theory, it is believed that plasma or other activated species aggressively etch (i.e., etch at a greater rate) areas containing a higher surface energy. As a result, particles or chunks of the channel walls around the defect detach, thereby introducing contaminates into the plasma system and ultimately causing the plasma vessel 30 to crack or fail. To reduce the amount of particle detachment, the channel walls can be pre-etched, polished, or annealed to reduce the microcracks to form a smooth skin layer over the defects. However, over time the smooth skin layer may be etched away by a plasma and contaminants will once again be introduced.

The device 10 also includes a gas bypass valve 60 and a bypass gas line 65 to direct all or some portion of the gas from the gas source 20 directly to the processing chamber 70. The bypass gas line 65 may be used to flush or pressurize the chamber, to aid in plasma initiation, or to improve uniformity and stability of the plasma in the plasma vessel 30.

The device 10 further includes a cooling system 80 in thermal communication with the plasma vessel 30. In general, in order to cool a dielectric body vessel 30, the cooling system 80 needs to be in intimate, direct connect with the channel walls 35 formed in the vessel 30. If the channel walls 35 are not properly cooled, the vessel may crack or disintegrate, thereby destroying the closed circuit, looped nature of the torodial vessel. In practice, cooling of channels 32 drilled or formed within vessel 30 is inefficient and difficult to perform, especially in light of varying thickness of the channel walls 35. As a result, an operator is limited with respect to the amount of power from power supply 50 which can be applied to the vessel 30 in fear of overheating the vessel 30.

Plasma Vessels

Figure 2:
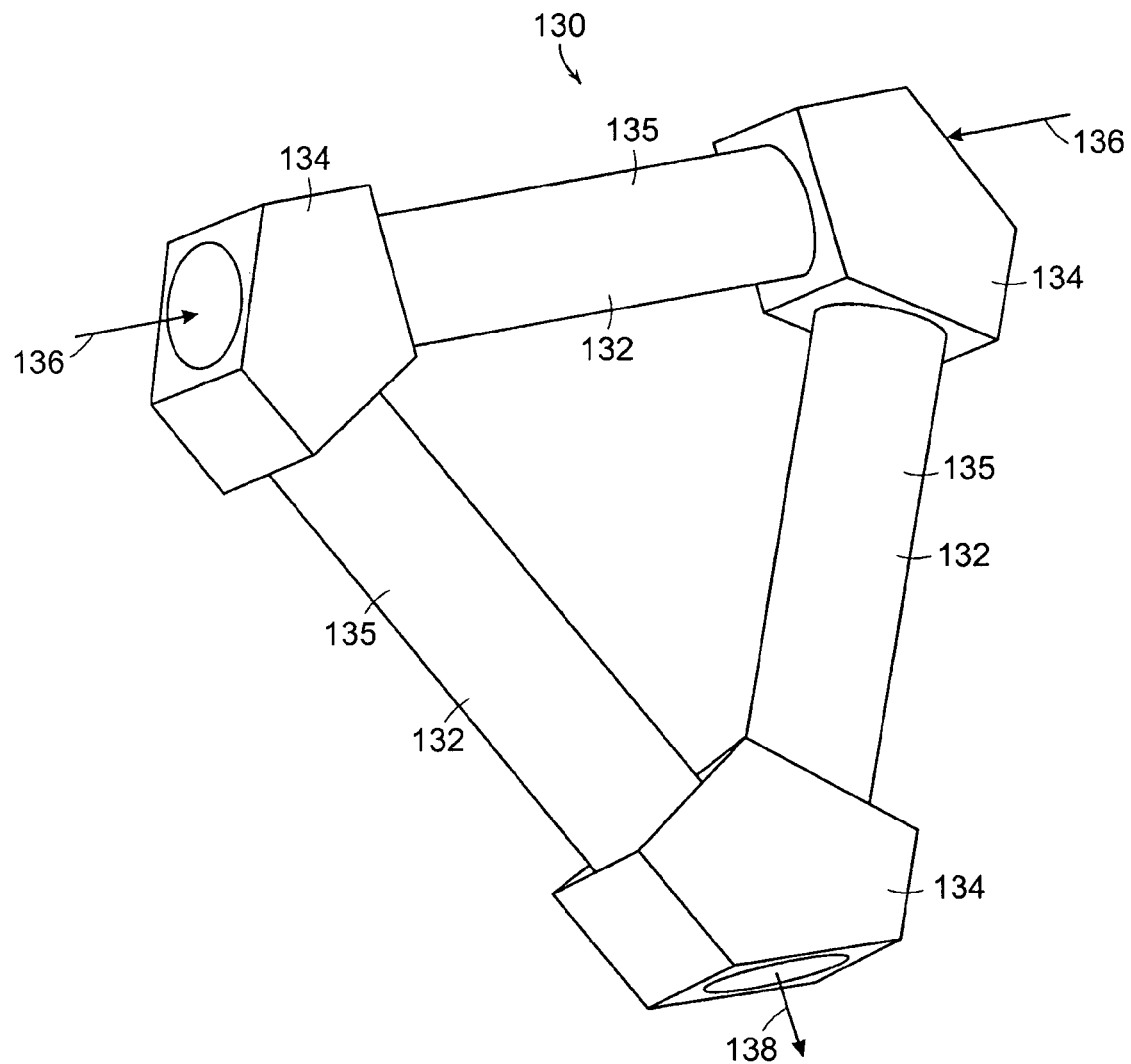
FIG. 2 is a perspective view of a plasma vessel in accordance with an embodiment of the invention.

Referring to FIG. 2, a plasma vessel 130, in accordance with one embodiment of the present invention, is illustrated. The plasma vessels 130 of the present invention can be used as substitutes for prior art plasma vessels 30 and in plasma devices 10 similar to those previously described. Plasma vessel 130, as shown in FIG. 2, includes a three generally linear tubes 132 and connectors 134 joined together to form a toroidal vessel. Each of the three generally linear tubes 132 are fluidly connected to at least two other tubes by one connector 134. The plasma vessel also includes gas flow injectors which allow gas to enter 136 and exit 138 the plasma vessel 130. Gas injectors in accordance with the present invention are shown in FIGS. 6, 7A, and 7B and will be described in a following section.

The tubes 132 are as-grown tubes (i.e., not processed to have a tube shape by drilling or etching) that have walls 135 of general uniform thickness. The tubes 132 and connectors 134 include a dielectric interior surface, which can be exposed to a plasma, and an exterior surface which is in thermal contact with a cooling system (shown in FIGS. 8 to 11 and described below). In addition, since tubes 132 are not processed into a tube shape, the interior surfaces of these tubes have a minimal concentration of surface defects (e.g., less than 5% of the surface area of the channels are filled with defects and in some embodiments the channel walls are defect free) and thus, a lower concentration of unwanted particle generation sites as compared to prior art plasma vessels. These tubes 132 and connectors 134 can be completely made from a dielectric material, such as, for example, sapphire, quartz, yttrium oxide, magnesium fluoride, or alumina. In other embodiments, the tubes 132 and/or the connectors 134 may be formed from a dielectric coated metal, such as, for example, aluminum or stainless steel having a dielectric film coating the interior surfaces of tubes and connectors.

In some embodiments, and preferably in embodiments including tubes 132 or connectors 134 completely formed of a translucent dielectric material, the exterior surface of the tubes 132 and/or the connectors 134 is be coated with a ultra-violet blocking film to prevent ultra-violet light emanating from the plasma to be transmitted outside of the plasma vessel 130. The ultra-violet blocking film can be formed of one or more of: a dielectric blocking UV compound (e.g., alumina, yttrium oxide, titanium dioxide, magnesium fluoride, magnesium oxide, and silicon dioxide), perfluoride compounds (e.g., ethylene tetrafluoroethylene), and sputtered metallic materials (e.g., gold, aluminum, or palladium). In certain embodiments, the ultra-violet blocking film is applied as a paint that includes UV blocking fillers, such as, for example, silicon dioxide, titanium dioxide, and clay. In general, a ultra-violet blocking film having a thickness of a few microns will prevent ultra-violet light transmission. In other embodiments, ultra-violet blocking films having a thickness greater than or less than a few microns can also be used to prevent ultra-violet light transmission.

Figure 3A:
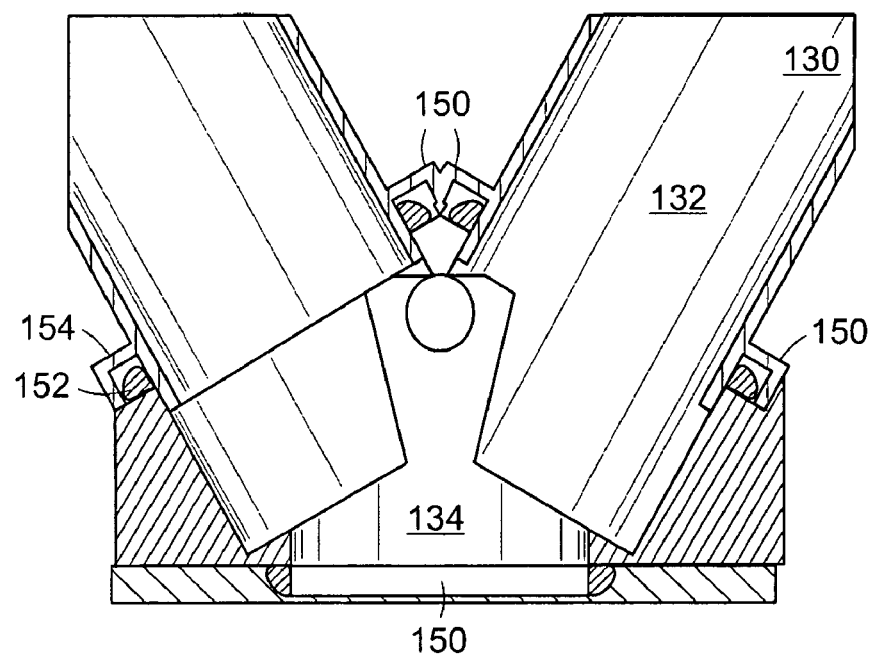
FIG. 3A is a cross-sectional view of a portion of the plasma vessel of FIG. 1.
Figure 3B:
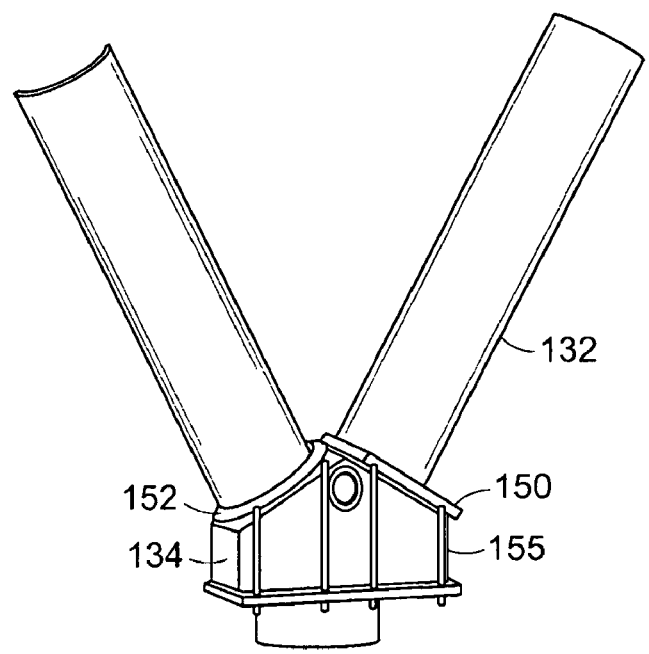
FIG. 3B is a front view of a portion of the plasma vessel of FIG. 1.

The tubes 132 and connectors 134 are joined together with sealing elements to form a leak-tight structure, which can be filled with gas from the gas source 20. Referring to FIGS. 3A and 3B, plasma vessel 130 includes three sealing elements 150 per connector 134 to seal each junction between tube 132 and connector 134. The sealing elements 150 include a resilient material that when crushed between two surfaces will deform to fill voids or gaps between the two surfaces, thereby preventing fluid leaks. In certain embodiments, the sealing elements 150 include an o-ring 152 or an o-ring 152 in combination with a crush plate 154. Screws or other fasteners 155 may also be used to thoroughly compress the o-rings and/or crush plates to obtain an improved seal.

In order to limit damage to the sealing elements 150, the o-rings should be made from a material that can withstand plasma exposure. As a result, in certain embodiments, the o-rings are formed from a metal that can withstand limited plasma exposure, such as, for example aluminum, or are metal coated, such as, for example, an aluminum coated perfluoroelastomer o-ring. To further protect the sealing elements from plasma damage, the sealing elements 150 may be positioned or disposed at a location adjacent to the junction between the tube 132 and the connector 134 and along an exterior surface of both the tube 132 and the connector 134. Referring to FIGS. 4A-4D, preferred locations of a sealing element 150 including an o-ring 152 and a crush plate 154 are illustrated near the junction between tube 132 and connector 134.

Figure 4A:
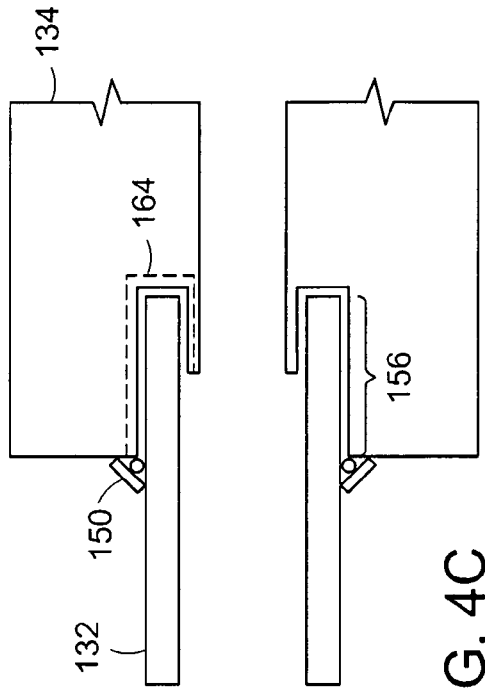
FIGS. 4A-4D are cross-sectional views of an interface between a tube and a connector used to form a plasma vessel.

In the embodiment shown in FIG. 4A, the tube 132 is inserted within the connector 134 and the sealing element 150 is positioned at an end of the connector 134 on the exterior surface of tube 132. The sealing element 150 is not only protected by being located on the exterior surfaces of tube 132 and connector 134, but also by overlap portion 156. In order for the plasma or activated corrosive gas products to come into contact with the sealing element 150, the plasma/products have to back fill along a length 158. As length 158 increases the probability of plasma exposure decreases. However, it should be noted that tube 132 is cooled through the direct thermal contact of the exterior surface of the tube with a cooling system. Thus, as length 158 increases, the amount of exterior surface of tube 132 decreases, which ultimately effects cooling and efficiency of the plasma device.

Figure 4B:
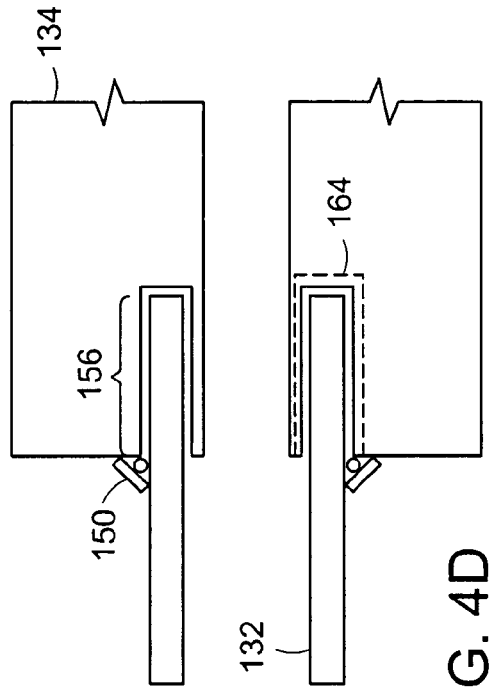

In the embodiment shown in FIG. 4B, a portion of the interior surface of the connector 134 is removed to accommodate an end portion of tube 132. As a result, the probability of o-ring plasma exposure has further decreased over the embodiment shown in FIG. 4A without decreasing cooling of tube 132. Specifically, a path length for the plasma/products to travel in order to reach the sealing elements 150 has increased over the embodiment shown in FIG. 4A. In this embodiment, the path length not only includes length 158, but also step 160.

Figure 4C:
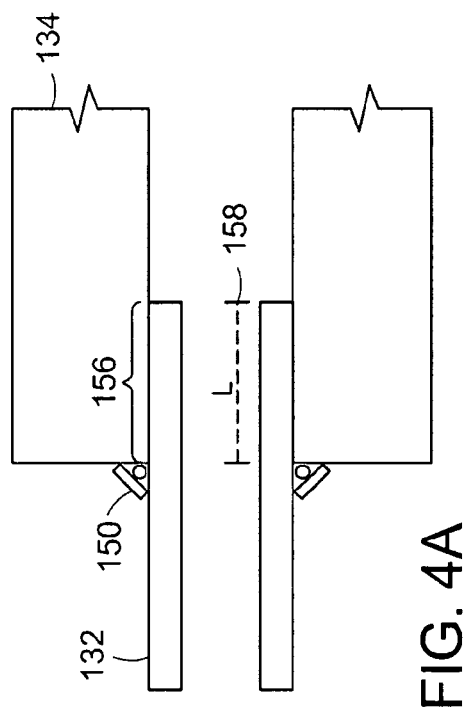
Figure 4D:
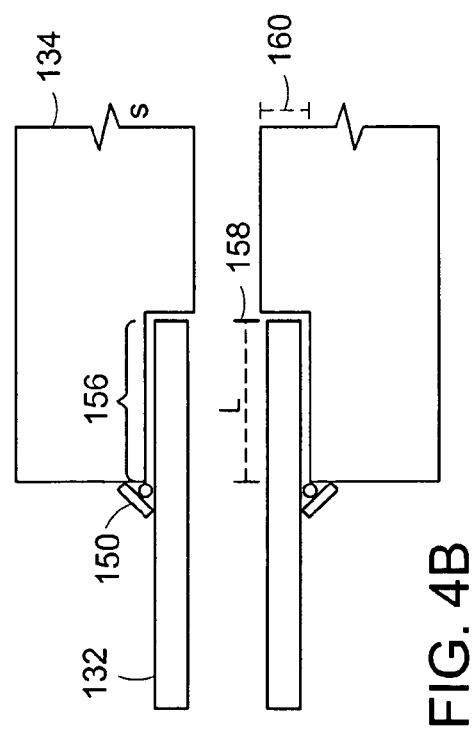

The embodiments shown in FIGS. 4C and 4D further increase the path length over that of embodiments shown in FIGS. 4A and 4B, by including a notch portion 162 in the end of connector 134. The tube 132 is inserted into the notch, which results in a path length equal to a distance 164. By including the notch in the connector 134, the path length the plasma/activated gas products must travel in order to reach the sealing element 150 increases over the path lengths shown in FIGS. 4A and 4B, however, the amount of tubular exterior surface is preserved for direct cooling. As a result, the probability of o-ring plasma exposure is further decreased, while cooling and device efficiency are maintained over the embodiments shown in FIGS. 4A and 4B.

Figure 5A:
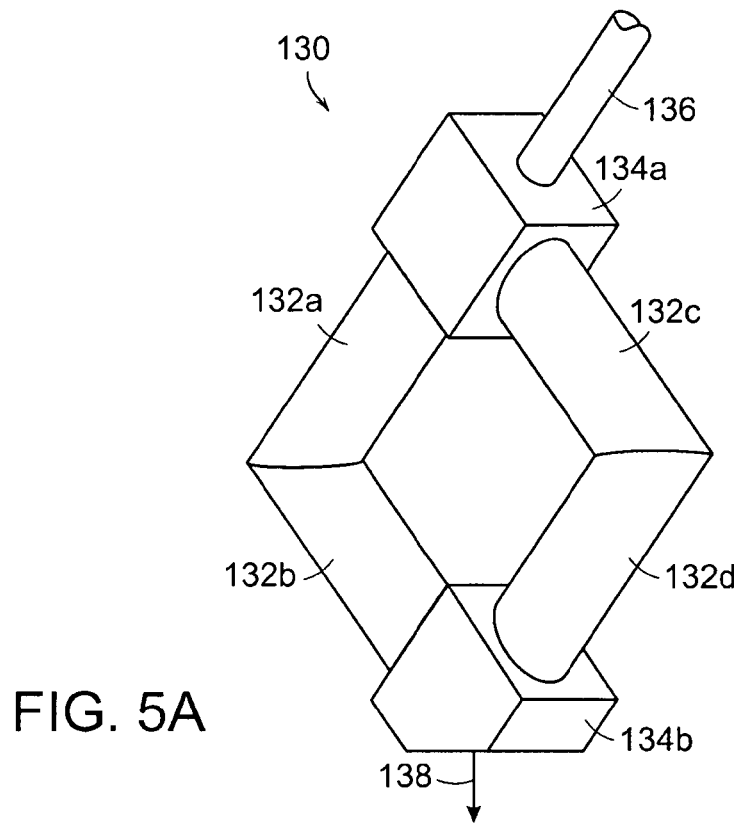

In some embodiments, such as the embodiments shown in FIGS. 5A-5E, the plasma vessel 130 can include two or more tubes bonded together by, for example, brazing, welding, or diffusion bonding. Referring to FIG. 5A, shown is a plasma vessel 130 having a square donut configuration having a gas inlet 136 and gas outlet 138. Tubes 132a and 132b are welded together to form one half of the square and tubes 132c and 132d are welded together to form a second half of the square plasma vessel 130. Connectors 134a and 134b complete the square plasma vessel 130 by fluidly connecting tubes 132a with tube 132c and tube 132b with tube 132d. Sealing elements positioned as described above are used to form a leak-tight seal between the tubes 132 and connectors 134.

In general, certain materials are easier to bond together than other materials (i.e., faster to bond, less expensive to bond, creates a more reliable bond). For example, quartz is easier to bond together than sapphire, which has a higher softening temperature.

Figure 5B:
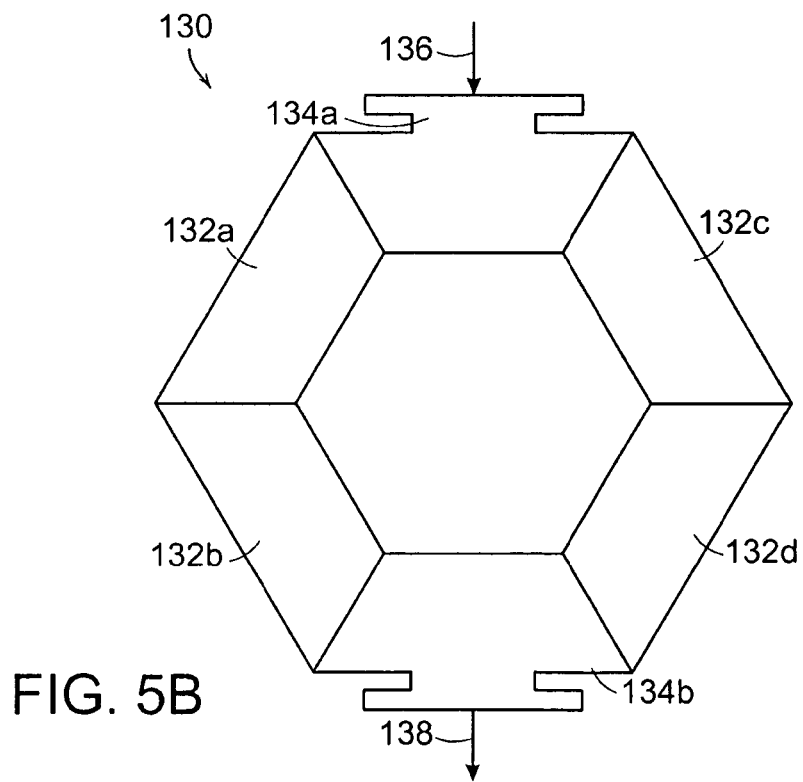

FIG. 5B illustrates another embodiment including two or more bonded tubes. The plasma vessel 130 shown in FIG. 5B has hexagon donut-shaped configuration having a gas input 136 and gas output 138. Tube 132a is welded to tube 132b to form a first portion of the plasma vessel 130 and tube 132c is welded to tube 132d. To complete the vessel 130 tubes 132a and 132c are each welded to connector 134a and tubes 132b and 132d are brazed to connector 132b. Since tubes 132a and 132c and connector 134a are welded together, a leak-tight joint is formed without the use of sealing elements 150 as described above.

Figure 5C:
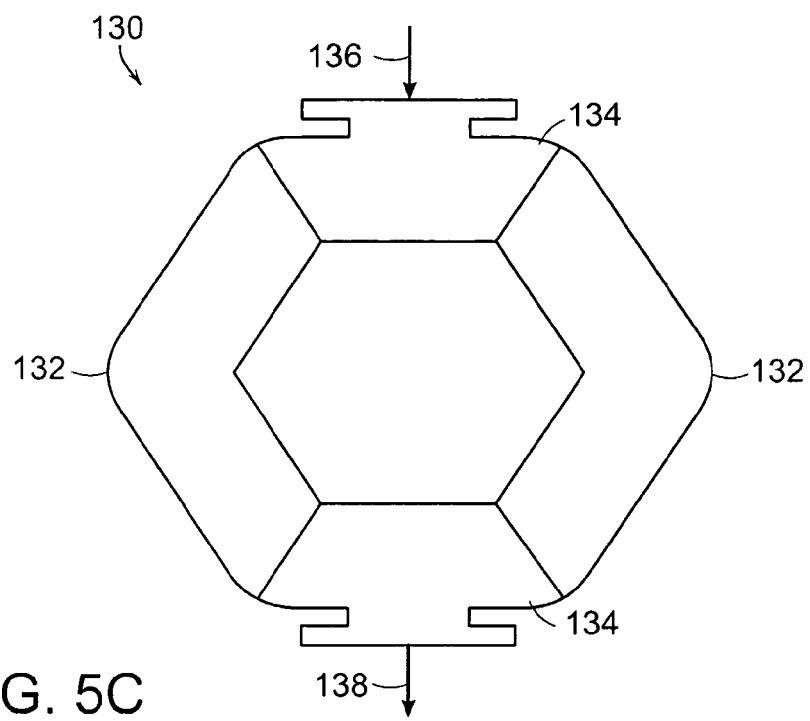
Figure 5D:
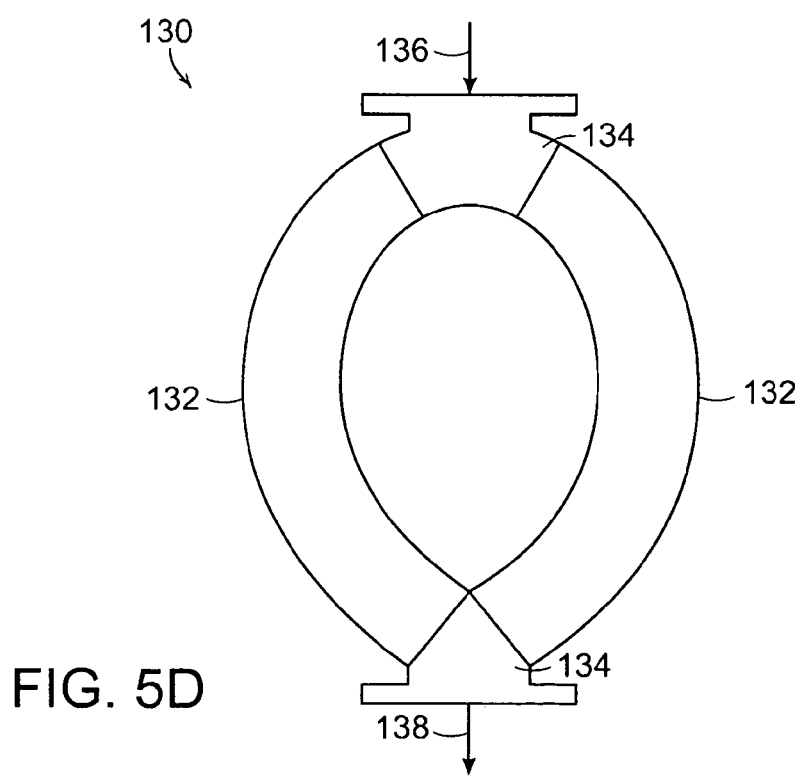
Figure 5E:
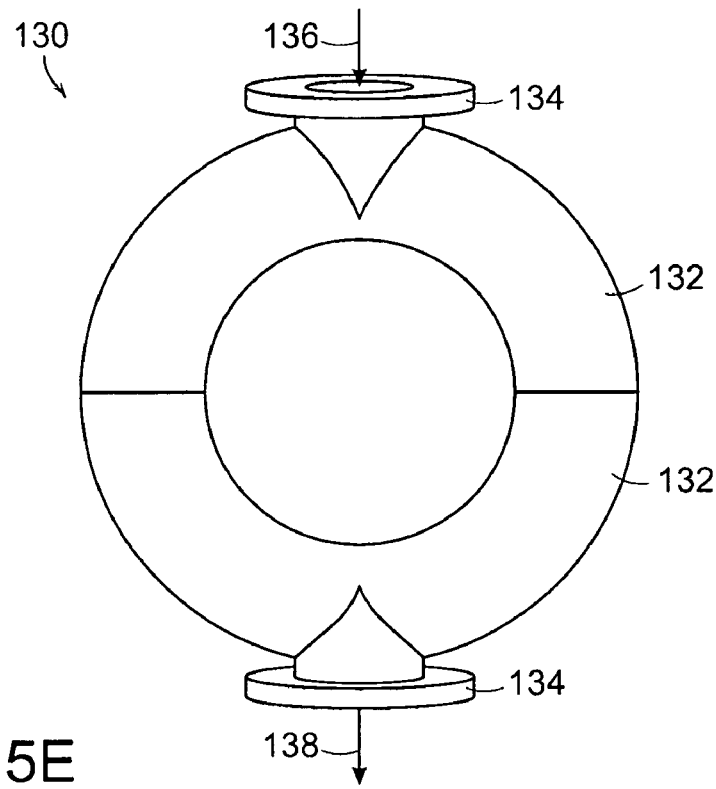

FIGS. 5C, 5D, and 5E illustrate further embodiments utilizing welding of tubes 132 and connectors 134 to form a plasma vessel 130. In FIGS. 5C, 5D, and 5E, generally linear tubes 132 are bent under temperature and pressure to form a portion of the plasma vessel 130. After bending the tubes to have the desired shape (e.g., angular shapes, curved or rounded shapes), the tubes are welded to connectors 134 to form a leak-tight plasma vessel 130 having a gas input 136 and a gas output 138. In some embodiments, such as, for example, the embodiment shown in FIG. 5D, the gas output 138 has a larger (wider) internal diameter than the internal diameter of tubes 132. By having a larger internal diameter in the gas output 138 than the tubes 132, better laminar flow properties may be achieved. In addition, a reduction in heat per unit area is also achieved by increasing the internal diameter. Thus, the surface temperature of gas output 138 is reduced as compared to tube 132.

Figure 5F:
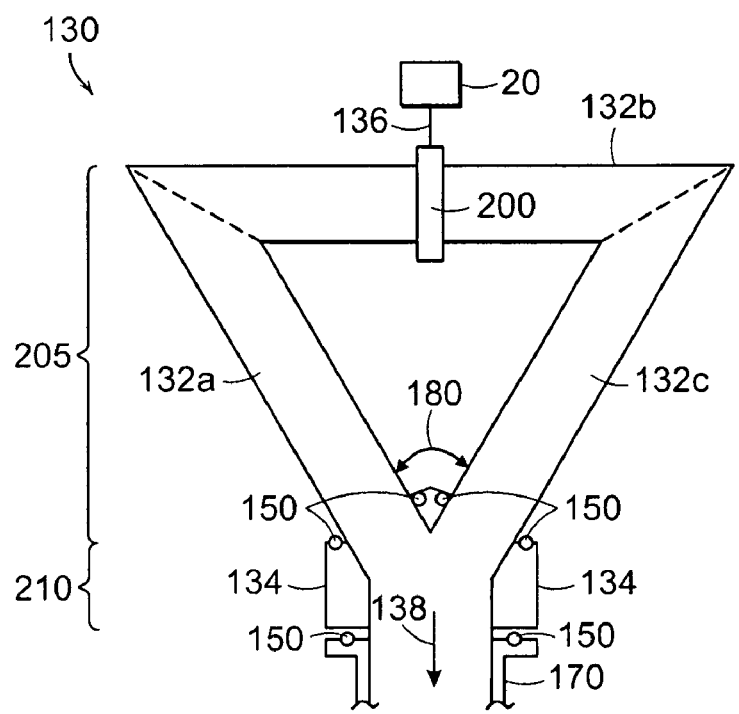

The plasma vessel 130 embodiments shown in FIGS. 5F and 5G utilize a combination of welded tubes 132 and connectors 134. Specifically, the plasma vessel 130 shown in FIG. 5E includes three tubes 132a, 132b, and 132c welded together to form a portion of a triangularly-shaped plasma vessel. To complete the plasma vessel, connector 134 is attached to non-welded ends of tubes 132a and 132c by sealing elements 150 to form an apex of the triangle. Connector 134 is further attached to a plasma processing chamber or tool 170 wherein workpieces are exposed to the plasma formed within the plasma vessel 130.

Gas source 20 is connected to plasma vessel 130 through gas input 136 and gas manifold 200 described in further detail below. The shape and configuration of the plasma vessel in combination with the plasma gas parameters (e.g., flow rate, pressure within the plasma controller, and temperature) play a role in determining the plasma output 138 parameters. That is, the flow of the plasma within the plasma vessel will depend upon not only the gas flow injected into the plasma vessel, but also upon the shape of the plasma vessel itself. For example, angle 180 can have a value anywhere between about 10 degrees and about 180 degrees. The value selected for angle 180 will play a role in determining the flow of plasma thorough part 134. Under the influence of the same gas input parameters, some values of angle 180 will result in a laminar, efficient flow through part 134. Other values of angle 180 for the same gas input parameters will result in a turbulent, non-efficient flow through part 134. For the particular configuration shown in FIG. 5F, a value of about 10 degrees to about 90 degrees provides effective plasma flow conditions through part 134.

While in most embodiments tubes 132 and connectors 134 will generally be formed of the same materials for design simplicity, in certain embodiments, tubes 132 and 134 may be formed of different materials. For example, the tubes 132 in FIG. 5F may be formed quartz, while connector 134 may be formed from sapphire. This particular embodiment provides a plasma vessel 130 with welding ease for the top portion 205 of the plasma vessel 130 and a bottom portion 210 that can withstand corrosive fluorine environments. Thus, a plasma vessel 130 having a top portion 205 formed of quartz and a bottom portion 210 formed of sapphire can additionally include a fluorine gas injector disposed within connector 134 for down-stream injection of fluorine to the plasma exiting 138 the plasma vessel 130.

Gas Flow Injectors

In order to form a plasma within plasma vessel 130, a plasma gas must be injected into the plasma vessel 130 through a gas injector 200. In certain embodiments, such as those shown in FIGS. 5A-5B, the gas injector is disposed with one of the connectors (e.g., connector 134a). That is, the gas from the gas source 20, enters the plasma vessel 130 through one of the connectors 134. Referring to FIG. 6, a gas injector 200 disposed within a connector 134 is configured to swirl the gas as it enters the vessel. As the gas passes through gas injector 200, its flow altered to create swirling patterns, which are easier to ignite into a plasma once inside the plasma vessel. Gas injector 200, shown in FIG. 6, may be inserted into a flanged gas inlet opening, such as the flanged opening in connector 134a shown in FIG. 5B.

In other embodiments, such as the embodiments illustrated in FIGS. 7A-7B, the gas injector 200 is positioned along one of the tubes 132 forming the plasma vessel 130. Specifically, the gas injector 200, which is in fluid communication with the gas source 20 through gas inlet 136 includes a gas manifold 220 surrounding a plurality of holes 225 disposed within the wall 135 of tube 132. To create a leak-tight seal between the gas manifold 220 and tube 132, several (e.g., two, three, four, five or six) sealing elements 150 are crushed between the tube 132 and the gas manifold 220.

In certain embodiments, multiple gas injectors 200 may be utilized. For example, a first flow injector may be used to provide the plasma vessel 130 with gas used to generate the plasma, a second gas injector may be provided to add a gas containing one or more corrosive species, such as fluorine or $CHF_3$ gas down stream from the first gas injector, and a third gas injector may be provided to transmit the plasma formed within the plasma vessel 130 into a plasma chamber 170.

Cooling System

Figure 8A:
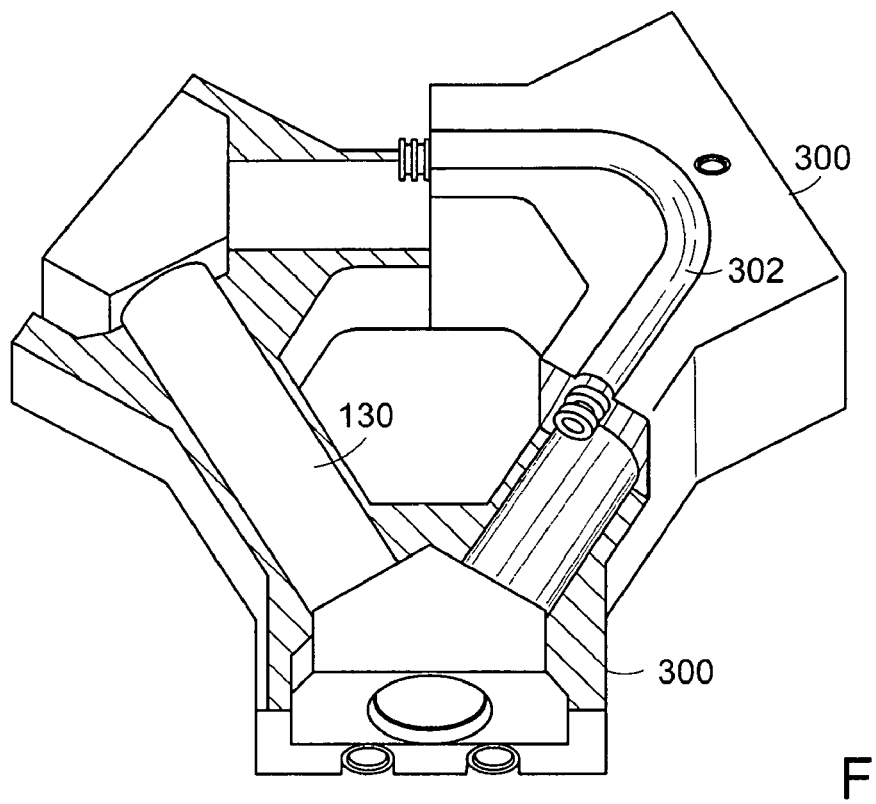
FIGS. 8A and 8B illustrate a heat sink surrounding a plasma vessel in accordance with one embodiment of the invention.
Figure 8B:
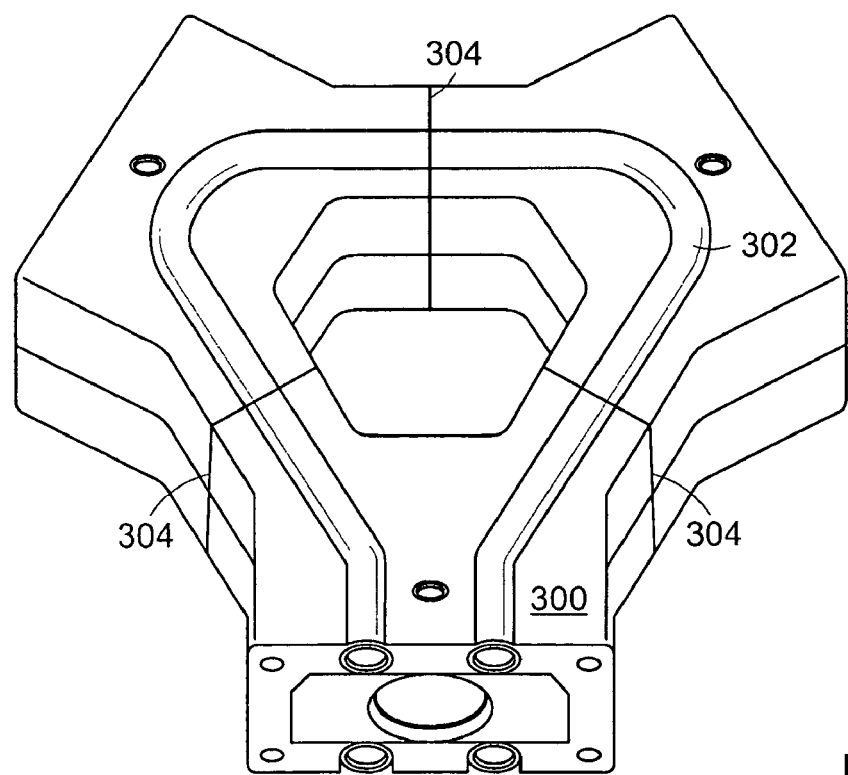

In order to provide a stable, reproducible, high-energy plasma, the plasma vessel must be evenly cooled so as to avoid localized heating and resulting damage. The plasma vessels 130 described herein maybe be cooled between two heat sinks 300 (e.g., cooling plates), as shown in FIG. 8A and FIG. 8B. (FIGS. 8A and 8B illustrate the same perspective view of the heat sink 300, however a portion of a top cooling plate is removed in FIG. 8A to expose the positioning of the plasma vessel 130.) The heat sinks 300 are in close proximity to plasma vessel 130 and can be directly cooled by a circulating fluid in an embedded tube 302, and/or cooled conductively through thermal contact with another heat sink, or through by air flowing above and below the heat sinks 300.

Figure 9:
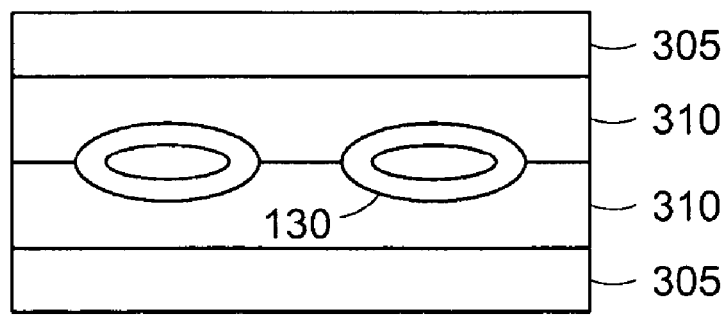
FIG. 9 is a cross-sectional view of a plasma vessel surrounded by a heat sink in accordance with another embodiment of the invention.

The heat sink can be formed from multiple rigid segments. Alternatively, the heat sink can be formed from multiple compliant segments that adopt the shape of the plasma vessel. Compliant heat sinks may include thermal transfer materials, such as, for example, T-pli 220 available from Thermagon, Inc. of Cleveland, Ohio and some potting materials, such as, for example, Stycast 5954 available from Emerson and Cummings, Inc of Canton, Mass. or 3-6655 available from Dow Corning, Inc. of Midland, Mich. In certain embodiments, the heat sink is formed of a combination of rigid segments and compliant segments. For example, in certain embodiments, a thermal pad or potting material may be positioned between the plasma vessel 130 and a cooling plate. The compliant thermal transfer material deforms to the shape of the plasma vessel 130 and the cooling plate, thereby providing better thermal contact between the plasma vessel and the heat sink 300. As shown in FIG. 8B, the heat sink 300 may include dielectric breaks 304 (e.g., small gaps) between the three segments forming the heat sink 300. FIG. 9 is a cross-sectional view of the plasma vessel 130 in thermal contact with a heat sink 300 including a cooling plate 305 and a thermal transfer material 310.

Figure 10:
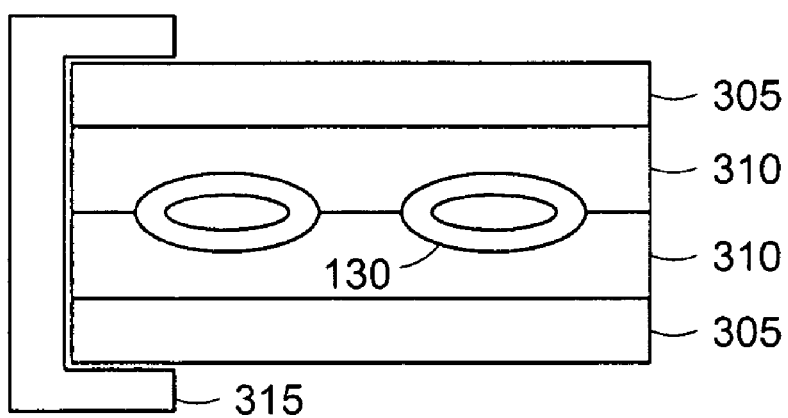
FIG. 10 is a cross-sectional view of plasma vessel surround by a heat sink in accordance with another embodiment of the invention.
Figure 11:
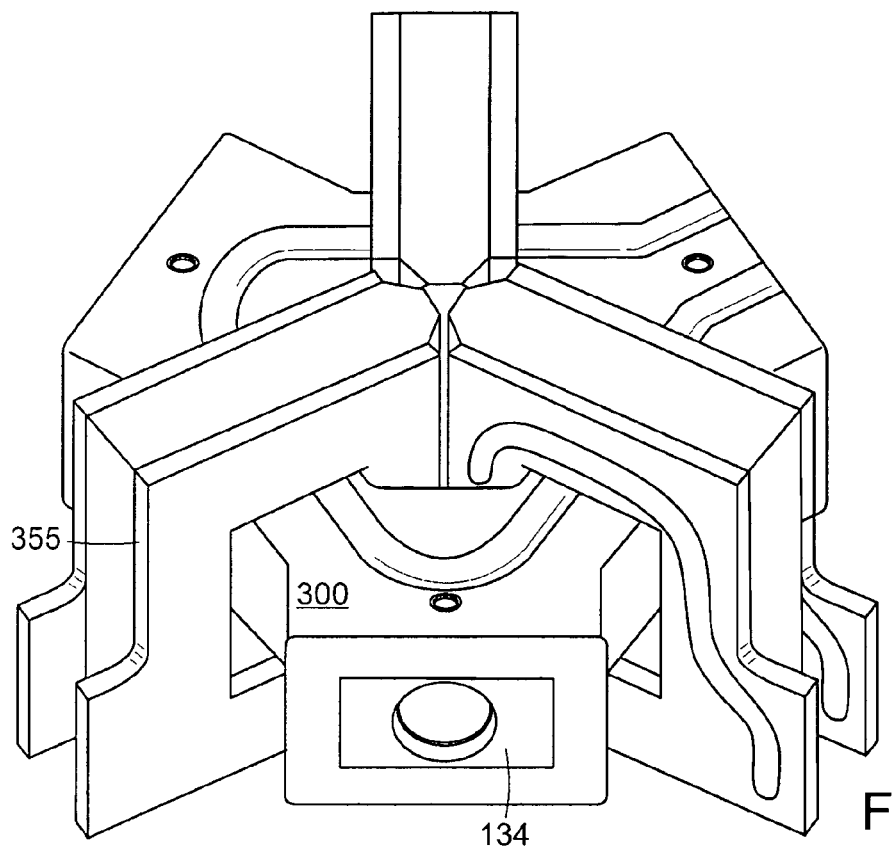
FIG. 11 is a perspective view showing a plasma vessel surrounded by a heat sink and a transformer in accordance with one embodiment of the invention.

Referring to FIG. 10, the heat sink 300 can further include a spring-loaded mechanism 315 that applies pressure to maintain thermal contact between the heat sink 300 and the plasma vessel 130. The spring-loaded mechanism 315 can be any type of spring or fastener that applies compression forces between two surfaces, such as a screw, a clamp, or a spring.

Figure 12:
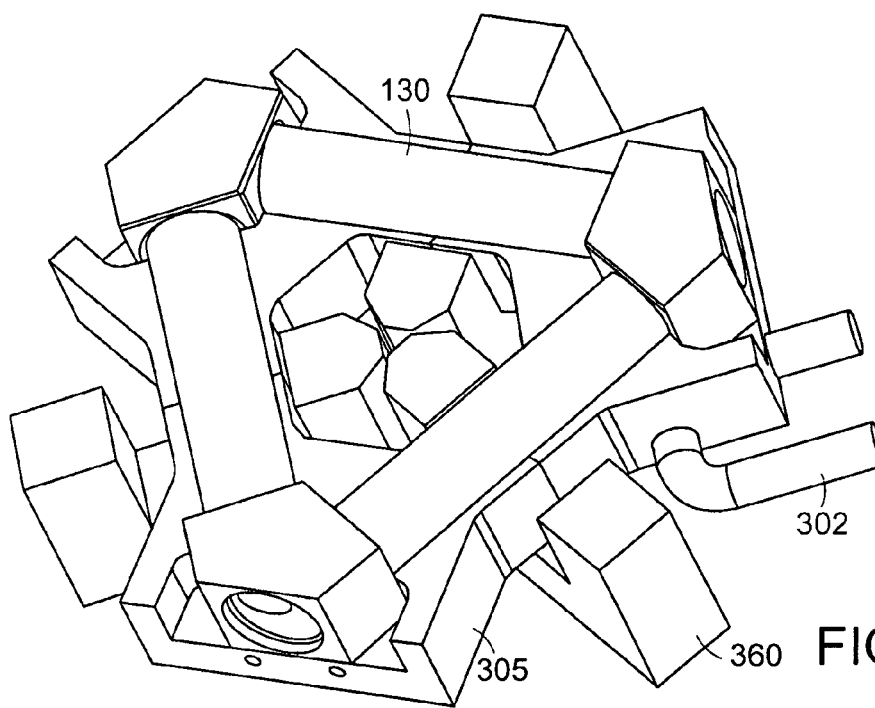
FIG. 12 is an exposed, partial view of a plasma vessel surrounded by a heat sink and a transformer in accordance with another embodiment of the invention.

In addition to the heat sinks 300 applied below and above the plasma vessel 130, in certain embodiments (see FIG. 11), additional heat sinks 350 surround ferrite transformers 355 used to inductively energize the plasma within the plasma vessel. These heat sinks 350 including the transformers 355 are positioned to encircle the tubes of the plasma vessel through the center or "donut-opening." In other embodiments, such as the embodiment shown in FIG. 12, transformers 360 are cooled by thermal contact with cooling plate 305.

Manufacturing of Plasma Vessels and Devices

Plasma vessels 130 are formed from a plurality of as-grown tubes 132 and machined connectors 134 that are connected together to form a torodial plasma vessel. As previously described, the tubes 132 and connectors have a dielectric interior surface and in some embodiments, are made solely from dielectric materials.

To join the tubes 132 and connectors 134, ends of the tubes are inserted into openings machined within the connectors 134. The ends of the tubes and the openings in the connectors are similarly sized so as to create a tight fit or joint. The joint is secured and sealed to prevent leaks by positioning a sealing element (e.g., an o-ring with a crush plate) near the joint on the exterior surface of the tube or by bonding the joint using brazing, welding, or diffusion bonding techniques. In general, the sealing elements are removable. As a result, joints sealed with sealing elements can be taken apart after use to replace one or more of the tubes 132 or connectors 134. Joints sealed with brazing, welding, or diffusion bonding techniques are permanent seals that do not allow for the replacement of a single tube 132 or connector 134 within the plasma device.

After the tubes and connectors are sealed together, one or more gas injectors are attached to the plasma device. A first gas injector 200 is connected to a gas inlet 136 which in turn is connected to the gas source. This gas injector is positioned either within one of the connectors 134 or along a length of one of the tubes 132. A second gas injector, used to transmit the plasma generated within the plasma vessel 130 to the processing chamber 170 is positioned down-stream of the first gas injector. In certain embodiments, a third gas injector used to inject fluorine or another corrosive gaseous material is attached to the plasma vessel in a location down stream of the first gas injector, but upstream of the second gas injector.

To form a complete plasma device, the plasma vessel including the plurality of tubes and attached connectors is sandwiched between two heat sinks. For example, in one embodiment, a deformable, foam based potting material, such as, for example, Stycast 5954 available from Emerson and Cummings, Inc of Canton, Mass. or 3-6655 available from Dow Corning, Inc. of Midland, Mich., is injected onto a surface of a cooling plate 305, thereby creating a deformable layer 310. The plasma vessel 130 is then positioned on top of the deformable layer 310. A second layer of potting material 310 is then sprayed on a surface of a second cooling plate. The second cooling plate 305 is positioned on top of the plasma vessel 130 so that the vessel is in direct contact and surrounded on all sides with at least one of the first and second deformable layers 310, as shown in FIG. 9. A spring-loaded mechanism 315 is then secured between the first and second cooling plates 305 as shown in FIG. 10 to actively compress the cooling plates and the deformable layers towards the plasma vessel.

The plasma vessel 130 surrounded by the first and second cooling plates 305 and first and second deformable layers 310 is then connected to the gas source 20 and the processing chamber 170. A transformer including a magnetic core and at least one winding is inserted into the donut opening of the torodial plasma vessel and wrapped around at least one tube 132 of the plasma vessel 130 to complete the plasma device 10.

As assembled above, the plasma vessel can be used to process a sample. For example, a silicon wafer positioned in a holder within the processing chamber 170 can be selectively etched through the use of a plasma generated in plasma vessel 130 and transmitted to processing chamber 170 through gas output 138.

After processing samples, plasma vessel 130 may become worn or may have material deposits coating the dielectric interior surfaces. To refurbish the plasma vessel, the cooling plates containing the plasma vessel therein are disconnected from the surrounding plasma device 10. The spring-loaded mechanism 315 is removed, thereby releasing the active compression of the cooling plates 305, deformable layers 310, and the plasma vessel 130. One of the cooling plates 305 and adjacent deformable layers 310 are removed to expose the plasma vessel 130.

Depending on the extent of wear or deposits, either the entire plasma vessel 130 or a portion of the plasma vessel 130 can be cleaned or replaced. For example, if only one or two of the tubes 132 of the plasma vessel shown in FIG. 2, are compromised, then an operator may elect to replace just the compromised tubes 132. To remove the tubes 132, the sealing elements 150 are first loosened and removed to allow the connectors to be detached from the ends of the tubes 132. The connectors may be cleaned with an acid or a surfactant prior to providing new tubes to replace the comprised or used tubes 132. In addition to cleaning the connectors, the gas injector 220 attached to either the tubes or the connector can also be cleaned or replaced.

In some embodiments, especially in embodiments including tubes which are welded together, non-welded connectors may be detached and cleaned or replaced. In certain circumstances, the operator may decide that it is most efficient to replace the entire plasma vessel with a new vessel.

After refurbishing all or a portion of the plasma vessel including the gas injectors, the operator may reuse the cooling plates and deformable layers to surround the new or refurbished plasma vessel. In general, the deformable layer is compliant enough to adopt to differences in shape or size between the used plasma vessel and the new or refurbished vessel, especially when compressed by the spring-loaded mechanism. As a result, effective and efficient cooling can be maintained even after plasma vessel refurbishment or replacement. The plasma vessel surrounded by the cooling plates and deformable layers can then be reattached to the plasma device and operated as described above.

While the invention has been particularly shown and described with reference to specific embodiments, it should be understood by those skilled in the art that various changes in form and detail may be made therein without departing from the spirit and scope of the invention as defined by the claims. For example, while the plasma vessel shown in FIG. 5E has been described in one embodiment to include three quartz tubes connected to a single sapphire connector, it is possible to manufacture the plasma vessel from four or more quartz welded tubes connected to a single or multiple sapphire connectors. In an embodiment having four quartz tubes and a single sapphire connector, the angle between two non-welded ends and the single connector can have a value of about 10 degrees to about 180 degrees, and preferably has a value of about 10 degrees to about 90 degrees.

What is claimed is:

1. A plasma vessel comprising:
a plurality of generally linear tubes each having a first end, a second end, a dielectric-coated interior wall, and a substantially uniform wall thickness and each arranged along an axis that linearly extends from the first end to the second end:
a plurality of connectors, wherein each of the plurality of connectors fluidly connects the first end of one of the plurality of generally linear tubes to the second end of another one of the plurality of generally linear tubes; and
a gas inlet for allowing gas into, and connected to, one of the plurality of generally linear tubes or one of the connectors.

2. The plasma apparatus of claim 1, wherein the plurality of generally linear tubes are formed of dielectric material.

3. The plasma apparatus of claim 2, wherein the dielectric material is selected from the group consisting of sapphire tubes, quartz tubes, yttrium oxide tubes, magnesium fluoride tubes, alumina tubes, or a combination thereof.

4. The plasma apparatus of claim 1, wherein the plurality of generally linear tubes is formed of metal material.

5. The plasma apparatus of claim 1 further comprising:
a gas injector fluidly connected to the gas inlet.

6. The plasma apparatus of claim 1, wherein the plurality of generally linear tubes include an ultra-violet blocking film disposed on an outer tubular surface.

7. The plasma apparatus of claim 6, wherein the ultra-violet blocking film is selected from the group consisting of alumina, yttrium oxide, titanium dioxide, magnesium fluoride, magnesium oxide, silicon dioxide, perfluoride compounds, sputtered metallic material, and combinations thereof.

8. The plasma apparatus of claim 1, wherein the plurality of connectors are formed of a metal that is coated with a dielectric material.

9. The plasma apparatus of claim 1, wherein the plurality of connectors are formed of a dielectric material.

10. The plasma apparatus of claim 1, wherein the plurality of generally linear tubes and plurality of connectors are positioned relative to each other such that a torodial vessel is formed.

11. The plasma apparatus of claim 1, wherein a gas is positioned along a wall of one of the plurality of generally linear tubes.

12. The plasma apparatus of claim 11, wherein the gas inlet comprises a manifold surrounding a plurality of holes disposed within a tubular wall.

13. The plasma apparatus of claim 1, wherein the inlet is positioned relative to one of the connectors.

14. The plasma apparatus of claim 13, wherein the gas inlet comprises a manifold in fluid communication with one of the connectors.

15. The plasma apparatus of claim 5, wherein the gas injector is positioned along a wall of one of the plurality of generally linear tubes.

16. The plasma apparatus of claim 15, wherein the gas injector comprises a manifold surround a plurality of holes disposed within a tubular wall.

17. The plasma apparatus of claim 5, wherein the gas injector is positioned relative to one of the connectors.

18. The plasma apparatus of claim 17, wherein the gas injector comprises a manifold in fluid communication with one of the connectors.

19. The plasma apparatus of claim 5 further comprising a second gas injector for delivering a corrosive gas into the plasma apparatus, the second gas injector being adjacent to the gas injector.

20. The plasma apparatus of claim 1 further comprising sealing elements disposed at a junction between one of the plurality of generally linear tubes and one of the plurality of connectors.

21. The plasma apparatus of claim 20, wherein the sealing elements are metal or metallic coated and are selected from the group consisting of radial o-rings and crush o-rings.

22. The plasma apparatus of claim 1, wherein each of the connectors receives an end portion of one or more of the plurality of generally linear tubes.

23. The plasma apparatus of claim 1 further comprising a cooling system including a heat sink positioned relative to the plurality of generally linear tubes.

24. The plasma apparatus of claim 23, wherein the heat sink includes a fluid-cooled cooling plate.

25. The plasma apparatus of claim 23, wherein an intermediary material is positioned between the heat sink and the plurality of generally linear tubes.

26. The plasma apparatus of claim 25, wherein the intermediary material comprises a thermal transfer material.

27. The plasma apparatus of claim 23, wherein the heat sink includes at least two segments coupled by at least one spring-loaded mechanism.

28. A plasma vessel comprising:
a plurality of as-grown crystal tubes each having a first end, a second end, a dielectric-coated interior wall, and a substantially uniform wall thickness each of the as-grown tubes bonded such that the first end of one of the plurality of as-grown tubes is bonded to the second end of another one of the plurality of as-grown tubes, at least one of the as-grown tubes has a gas inlet;
a gas injector fluidly connected to the gas inlet; and
a connector having a dielectric interior portion being fluidly connected between the gas injector and the gas inlet.

29. The plasma apparatus of claim 28 further comprising:
a plasma tool output port fluidly connected to the connector.

30. The plasma apparatus of claim 28, wherein bonds between the as-grown crystal tubes arc formed by brazing, welding, or diffusion bonding techniques.

31. The plasma apparatus of claim 28, wherein the plurality of as-grown crystal tubes comprise quartz tubes.

32. The plasma apparatus of claim 28, wherein the gas injector comprises a manifold surrounding a plurality of holes disposed within a tubular wall.

33. The plasma apparatus of claim 28, wherein the gas injector is fluidly connected to a gas inflow port.

34. The plasma apparatus of claim 28, wherein the connector comprises a sapphire or alumina connector.

35. The plasma apparatus of claim 28, wherein the gas inlet is defined by a non-bonded first end of one of the plurality of as-grown tubes and a non-bonded second end of another one of the plurality of as-grown tubes.

36. The plasma apparatus of claim 35, wherein the non-bonded first and second ends are positioned at an angle to each other that optimizes gas flow through the connector.

37. The plasma apparatus of claim 36, wherein the angle is between about 10 degrees and about 180 degrees.

38. The plasma apparatus of claim 37, wherein the vessel is formed of three tubes and the angle is between about 10 degrees and 90 degrees.

39. The plasma apparatus of claim 37, wherein the vessel is formed of four tubes and the angle is between about 10 degrees and 90 degrees.

40. The plasma apparatus of claim 28, wherein the plasma vessel includes an ultra-violet blocking film disposed on an exterior vessel surface.

41. The plasma apparatus of claim 28 further comprising a cooling system including a heat sink provided relative to the plasma vessel.

42. The plasma apparatus of claim 41, wherein the heat sink includes a water-cooled cooling plate.

43. The plasma apparatus of claim 41, wherein an intermediary material is positioned between the heat sink and the plasma vessel.

44. The plasma apparatus of claim 43, wherein the intermediary material comprises a thermal transfer material.

45. The plasma apparatus of claim 41, wherein the heat sink includes at least two segments coupled by at least one spring-loaded mechanism.

* * * * *

UNITED STATES PATENT AND TRADEMARK OFFICE
CERTIFICATE OF CORRECTION

| | | |
|---|---|---|
| PATENT NO. | : 8,053,700 B2 | Page 1 of 1 |
| APPLICATION NO. | : 11/541388 | |
| DATED | : November 8, 2011 | |
| INVENTOR(S) | : Schuss et al. | |

It is certified that error appears in the above-identified patent and that said Letters Patent is hereby corrected as shown below:

In column 13 line 57, claim 11, insert "injector" after the word gas.

Signed and Sealed this
Twenty-fourth Day of January, 2012

David J. Kappos
*Director of the United States Patent and Trademark Office*